(12) United States Patent
Yamazaki et al.

(10) Patent No.: US 6,262,438 B1
(45) Date of Patent: Jul. 17, 2001

(54) ACTIVE MATRIX TYPE DISPLAY CIRCUIT AND METHOD OF MANUFACTURING THE SAME

(75) Inventors: Shunpei Yamazaki, Tokyo; Yasuhiko Takemura, Shiga, both of (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 08/962,047

(22) Filed: Oct. 31, 1997

(30) Foreign Application Priority Data

Nov. 4, 1996 (JP) ................................... 8-308684
Nov. 6, 1996 (JP) ................................... 8-310033

(51) Int. Cl.[7] .................................................. H01L 29/04
(52) U.S. Cl. ............................................. 257/72; 257/59
(58) Field of Search .......................... 257/59, 72; 349/38, 349/39, 110, 111

(56) References Cited

U.S. PATENT DOCUMENTS

| 4,213,139 | * | 7/1980 | Rao | ...................... 257/366 |
|---|---|---|---|---|
| 5,629,583 | * | 5/1997 | Jones et al. | ........................... 313/495 |
| 5,757,453 | * | 5/1998 | Shin et al. | ............................. 257/59 |
| 5,917,563 | * | 6/1999 | Matsushima | ............................ 349/38 |

* cited by examiner

Primary Examiner—Carl Whitehead, Jr.
Assistant Examiner—Jeff Vockrodt
(74) Attorney, Agent, or Firm—Fish & Richardson PC

(57) ABSTRACT

An active matrix circuit using top-gate type thin-film transistors is characterized in that an auxiliary capacitor is formed between a black matrix and an N-type or P-type active layer, and uses, as a dielectric, a silicon nitride layer used as a passivation film of an interlayer insulator. Also, an active matrix circuit using bottom-gate type thin-film transistors is characterized in that two auxiliary capacitors. One of the auxiliary capacitors is formed between a capacitor wiring line formed on a substrate and an N-type or P-type conductive region or a metal wiring line connected to the conductive region, and uses a gate insulating film as a dielectric. The other one of the auxiliary capacitors is formed between a black matrix and said N-type or P-type conductive region or said metal wiring line connected to the conductive region, and uses a silicon nitride layer used as a passivation film as a dielectric. Said two auxiliary capacitors are located in three-dimension for preventing aperture ratio from lowering.

27 Claims, 9 Drawing Sheets

ACTIVE MATRIX TYPE DISPLAY CIRCUIT AND METHOD OF MANUFACTURING THE SAME

BACKGROUND OF THE INVENTION

1. Field of the Invention

The present invention relates to a circuit structure of a pixel region of an active matrix type display device using thin-film transistors, and particularly to a structure of an auxiliary capacitor.

2. Description of the Related Art

In recent years, a technique for manufacturing thin-film transistors (TFT) on an inexpensive glass substrate has been rapidly developed. The reason is that the demand for active matrix type liquid crystal display devices has been increased.

In the active matrix type liquid crystal display device, thin-film transistors are respectively arranged for each of several tens to several million pixels arranged in matrix form to control electrical charge going in and out of the respective pixel electrodes by a switching function of the thin-film transistor.

A liquid crystal is placed between the respective pixel electrodes and opposing electrodes so that a kind of capacitor is formed. Accordingly, if going in and out of electrical charge to the capacitor is controlled by the thin-film transistor, the electro-optical characteristics of the liquid crystal are changed so that a picture image can be displayed by controlling light transmitting through a liquid crystal panel.

The capacitor having such a structure has a problem that since a hold voltage of the capacitor is gradually decreased by a leak current, the electro-optical characteristics of the liquid crystal is changed so that the contrast of display of a picture image is deteriorated.

Then, such a structure becomes common that another capacitor referred to as an auxiliary capacitor is disposed in series with the capacitor constituted by the liquid crystal so that electrical charge lost through a leak or the like is supplied to the capacitor constituted by the liquid crystal.

FIG. 4 is a circuit diagram showing a conventional active matrix type liquid crystal display device. The active matrix type liquid crystal display circuit is roughly divided into three parts. That is, the circuit is divided into a gate driver circuit 62 for driving gate wiring lines (scan wiring lines) 64, a data driver circuit 61 for driving data wiring lines (source wiring lines, signal wiring lines), and an active matrix circuit 63 in which pixels are provided. Among them, the data driver circuit 61 and the gate driver circuit 62 are generally referred to as a peripheral circuit.

In the active matrix circuit 63, a number of gate wiring lines 64 and data wiring lines 65 are provided so as to cross with each other, and pixel electrodes 67 are provided at each intersection point. Further, a switching element (thin-film transistor) 66 for controlling electrical charge going in and out of the pixel electrode is provided. Still further, as described above, in order to suppress the change of a voltage of a pixel due to the leak current, an auxiliary capacitor 68 is provided in parallel with a capacitor of the pixel (FIG. 4).

Various methods of forming an auxiliary capacitor have been proposed, and the most typical structure of the auxiliary capacitor uses the overlap of an active layer (semiconductor layer) of a thin-film transistor and a gate wiring line.

FIGS. 3A to 3E show the state of a cross section of an active matrix type circuit using top-gate type thin-film transistors, while explaining the manufacturing steps. An intrinsic active layer 42 is formed on a substrate 41, and is selectively doped with N-type or P-type impurities to form a conductive region 44. Further, a gate insulating film 43 is formed so as to cover the active layer, and gate wiring lines 45 and 46 are formed (FIG. 3A).

In general, the gate wiring lines 45 and 46 use wiring lines in rows different from each other. In the pixel shown in the drawing, the gate wiring line 45 functions as a gate electrode of the thin-film transistor, and the gate wiring 46 functions as an electrode of an auxiliary capacitor 49. The reason why the wiring lines in the different rows are used is that if the gate wiring lines 45 and 46 are those in the same row, parasitic capacitance between a drain and the gate electrode of the thin-film transistor becomes extremely large, so that it constitutes an obstacle to a switching function. In the drawing, the gate wiring 46 is for constituting the auxiliary capacitor, and another wiring line for only increasing an aperture ratio is not generally formed.

Next, impurities having the same conductivity as the conductive region 44 are implanted while using the gate electrode as a mask so that a source 47 and a drain 48 are formed in a self-alignment manner. In this way, the auxiliary capacitor 49 is formed between the gate wiring line 46, and the conductive region 44 and the drain 48 (FIG. 3B).

Thereafter, a first interlayer insulator including a silicon nitride layer 50 as a passivation film and a layer 51 of a material suitable for flattening such as polyimide, is formed and is etched so that a contact hole reaching to the source 47 is formed. Then, a data wiring line 52 is provided (FIG. 3C).

Since the conductivity of the thin-film transistor is varied by irradiation of light, in order to prevent the variation, a coating film (black matrix) 54 having light shielding properties is overlapped on the thin-film transistor. Further, in order to prevent mixing of colors and degrees of brightness between pixels and to prevent poor display due to the disturbance of an electric field at boundary portions of the pixels, the above light shielding coating film is also formed between pixels. Thus, the light shielding coating film has a matrix shape so that it is called a black matrix (BM). The BM 54 is formed on a second interlayer insulator 53 (FIG. 3D).

Thereafter, a third interlayer insulator 55 is formed, and is etched to form a contact hole reaching to the drain 48 (or conductive region 44). Further, a pixel electrode 56 is formed of a transparent conductive coating film. If the BM is formed of an insulating material, the third interlayer insulator 55 is not necessary (FIG. 3E).

Among the above steps, main steps are enumerated as follows.
A forming step of the active layer 42
B selective doping step for forming the conductive region 44
C forming step of the gate insulating film 43
D forming step of the gate wiring lines 45 and 46
E self-alignment doping step for forming the source 47 and the drain 48
F forming step of the first interlayer insulators 50 and 51
G forming step of the contact hole
H forming step of the data wiring line 52
I forming step of the second interlayer insulator 53
J forming step of the black matrix 54
K forming step of the third interlayer insulator 55
L forming step of the contact hole
M forming step of the pixel electrode 56

Among the above steps, eight steps A, B, D, G, H, J, L and M are accompanied by a photolithography step.

FIGS. 10A to 10D show the state of a cross section of an active matrix circuit using bottom-gate type thin-film transistors while explaining the manufacturing steps. A gate wiring line 172 and a capacitor wiring line 173 are formed on a substrate 171. The capacitor wiring line 173 may also serves as a gate wiring line, and in this case, an opening region can be made large as compared with the case where the capacitor wiring line is especially provided.

In the case where the capacitor wiring line 173 is used as the gate wiring line, the wiring line of a row different from the gate wiring line 172 is used. If the gate wiring line 172 and the wiring line 173 are in the same row, parasitic capacitance between the drain and the gate electrode of the thin-film transistor becomes extremely large, so that switching is hindered.

Incidentally, in the case where the capacitor wiring line 173 serves also as the gate wiring line, there is also such a defect that the parasitic capacitance of the wiring line becomes large so that the operation speed slows down and the signal shape becomes dull.

Next, a gate insulating film 174 covering these wiring lines, and an intrinsic semiconductor layer 175 are formed. Further, conductive regions (source, drain) 176 and 177, which are doped with N-type or P-type impurities and are connected to the semiconductor layer 175, are formed. Further, a data wiring line 178 is formed (FIG. 10A).

In this way, an auxiliary capacitor 179 including the gate insulating film 174 as a dielectric is obtained between the capacitor wiring line 173 and the conductive region 177.

Thereafter, a first interlayer insulator including a silicon nitride film 180 as a passivation film and a layer 181 made of a resin material suitable for flattening, such as polyimide, is formed (FIG. 10B).

Since the conductivity of the thin-film transistor is changed by irradiation of light, in order to prevent the variation, a coating film (black matrix) 182 having light shielding properties is overlapped on the thin-film transistor. Further, in order to prevent the mixture of colors and degrees of brightness between pixels and to prevent poor display due to the disturbance of an electric field at boundary portions of the pixels, the above light shielding coating film is also formed between the pixels. Thus, the light shielding coating film has a matrix shape so that it is called a black matrix (BM). If the BM 182 is formed on the substrate on which the active matrix circuit is provided, it has an effect in integration of pixels. In this case, the BM 182 is formed on the polyimide layer 181 of the first interlayer insulator (FIG. 10C).

Thereafter, a second interlayer insulator 183 is formed. The second and the first interlayer insulators are etched to form a contact hole reaching to the conductive region 177. Further, pixel electrodes 184 and 185 (pixel electrodes of other pixels) are formed of a transparent conductive coating film. In general, the BM and the pixel electrodes are formed so as not to form a portion where they are not overlapped with each other. If the BM 182 is formed of an insulating material, the second interlayer insulator 183 is not necessary (FIG. 10D).

The active matrix circuit of the above structure has a feature that since the gate insulating film having a high withstand voltage can be used as an insulator (dielectric) of the auxiliary capacitor, large capacitance can be obtained.

However, in some cases, the capacitance is insufficient. In order to increase the auxiliary capacitance, the area occupied by the capacitor wiring line must be increased. That is, according to a conventional method, the auxiliary capacitor has a main structure of two-dimensional extension.

However, since the portion where the capacitor wiring line is disposed, does not transmit light, an opening rate is lowered.

Further, the conventional method has a defect that since the gate wiring also serves as the electrode of the auxiliary capacitor, the parasitic capacitance of the wiring line becomes large, so that the operation speed slows down and the signal shape becomes dull. With respect to this defect, there is a method in which the gate wiring line and the wiring line of the auxiliary capacitor are separately provided. However, as described above, the area occupied by the wiring lines is increased by that, so that the opening rate is lowered.

The present invention intends to solve these problems and to increase auxiliary capacitance by constituting an auxiliary capacitor in three-dimension without lowering an aperture ratio.

Further, the active matrix circuit using top-gate type thin-film transistors has such a defect that two doping steps are necessary, and a photolithography step is necessary to define a doping region for the purpose of forming the conductive region 44.

With respect to this defect, if doping of the source and drain is also carried out in the stage of the above step B, the number of doping steps can be made one. However, in that case, a self-alignment type transistor can not be made, parasitic capacitance is large, and there is a fear that the parasitic capacitance would vary for each transistor. Further, also in this case, the photolithography step at doping is necessary.

The steps of this improved conventional method are as follows.

A forming step of the active layer 42
B' selective doping step for forming the conductive region 44, source 47, and drain 48
C forming step of the gate insulating film 43
D forming step of the gate wiring lines 45 and 46 (there is no step corresponding to step E)
F forming step of the first interlayer insulators 50 and 51
G forming step of the contact hole
H forming step of the data wiring line 52
I forming step of the second interlayer insulator 53
J forming step of the black matrix 54
K forming step of the third interlayer insulator 55
L forming step of the contact hole
M forming step of the pixel electrode 56

Among the above steps, eight steps A, B, D, G, H, J, L and M are accompanied by the photolithography step.

SUMMARY OF THE INVENTION

The present invention has been made to improve the problems of the above steps.

According to the present invention, an active matrix circuit using top-gate type thin-film transistors is characterized in that a capacitor as an auxiliary capacitor is formed between a black matrix and an N-type or P-type active layer, and a silicon nitride layer (silicon nitride layer 50 in FIG. 3C) used as a passivation film of a first interlayer insulator is used as a dielectric of the auxiliary capacitor.

Further, according to the present invention, an active matrix circuit using bottom-gate type thin-film transistors is characterized in that a capacitor as an auxiliary capacitor is formed between a black matrix and an N-type or P-type conductive region (semiconductor layer) or a metal wiring line connected to the conductive region, and a silicon nitride layer (silicon nitride layer 180 in FIG. 10B) used as a passivation film of a first interlayer insulator is used as a dielectric of the auxiliary capacitor.

An active matrix type display circuit of the present invention comprises:

(1) top-gate type thin-film transistors, (2) an N-type or P-type active layer, (3) a conductive film functioning as a black matrix and kept at a constant potential, (4) a gate wiring line and a data wiring line, (5) a first interlayer insulator including a silicon nitride layer and a polyimide layer (the silicon nitride layer is located under the polyimide layer), and being positioned between the gate wiring line and the data wiring line, and (6) a second interlayer insulator positioned between the data wiring line and the conductive coating film.

A first aspect of the invention is characterized in that in the above structure, an auxiliary capacitor, which includes the active layer and the conductive coating film as both electrodes, and at least the silicon nitride layer of the first interlayer insulator as a dielectric, is formed at a portion where the polyimide layer of the first interlayer insulator and the second interlayer insulator are etched.

A second aspect of the invention is characterized in that in the above structure, the silicon nitride layer is located under the polyimide layer in the first interlayer insulator, and the conductive coating film has a portion which is in contact with the silicon nitride layer of the first interlayer insulator at a portion where the conductive coating film overlaps with the active layer.

In the first or second aspect of the invention, if the active layer functioning as an electrode of the auxiliary capacitor is continuous with the source or drain of the thin-film transistor, the circuit structure is simple and an occupied area can be decreased.

The dielectric of the auxiliary capacitor may be a multi-layer structure of the gate insulating film and the silicon nitride layer, or only the silicon nitride layer. In the former case, by utilizing the property of a withstand voltage of the gate insulating film, a possibility of short-circuiting is lowered. In the latter case, the dielectric becomes thin, and by using the silicon nitride having large dielectric constant, larger capacitance can be obtained.

In the first or second aspect of the invention, the thickness of the silicon nitride layer is not larger than 1000 Å, preferably not larger than 500 Å.

The main steps for obtaining the present invention of the above structure are as follows.

a forming step of an active layer (there is no step corresponding to step B)

c forming step of a gate insulating film d forming step of a gate wiring line e self-alignment doping step for forming a source and a drain (conductive region)

f forming step of a first interlayer insulator (containing a silicon nitride layer)

g forming step of a contact hole h forming step of a data wiring line i forming step of a second interlayer insulator x etching step of a hole for an auxiliary capacitor j forming step of a black matrix k forming step of a third interlayer insulator l forming step of a contact hole m forming step of a pixel electrode Among the above steps, eight steps a, d, g, h, x, j, l and m are accompanied by a photolithography step.

The number of total steps of the present invention is thirteen, while the number of those of the conventional method is thirteen and the number of those of the conventional improved method is twelve. Accordingly, although it appears that the method of the present invention is inferior to the conventional improved method, the invention is superior in that the thin-film transistor is formed in a self-alignment manner, so that although the number of steps is increased by one, the present invention is still superior to the conventional method and the conventional improved method.

With respect to the number of photolithography steps, the number is identical among the conventional method, the convention improved method, and the present invention. Since the thin-film transistor is a self-alignment type, the present invention is equivalent to the conventional method, and it is concluded that the present invention is superior to the conventional method in that the number of doping steps is one.

The invention is superior in mass production since the number of doping can be made one, as described above. In addition, in the present invention, since the gate wiring line is not an electrode of the auxiliary capacitor, there does not occur such a problem that a gate signal becomes dull. However, this does not deny the combination of the present invention with the prior art. It is useful to obtain larger capacitance by the combination. Further, in addition to the above step, further steps may be added to make the circuit of a higher order, which is also included in the scope of the present invention. For example, it does not matter even if the number of steps are increased to manufacture an advanced thin-film transistor. The same may be said of the wiring structure.

Another active matrix type display circuit of the present invention comprises:

(1) bottom-gate type thin-film transistors, (2) a gate wiring line and a data wiring line, (3) a conductive coating film functioning as a black matrix and kept at a constant potential, (4) an N-type or P-type semiconductor layer (or a metal wiring line connected to the semiconductor layer and located in the same layer as the data wiring line), and (5) an interlayer insulator including a silicon nitride layer and a polyimide layer (the silicon nitride layer is located under the polyimide layer), and being positioned between the conductive coating film and the data wiring line.

A third aspect of the present invention is characterized in that in the above structure, an auxiliary capacitor, which includes the semiconductor layer (or a metal wiring line) and the conductive coating film as both electrodes, and at least the silicon nitride layer of the interlayer insulator as a dielectric, is formed at a portion where the polyimide layer of the interlayer insulator was etched.

A fourth aspect of the present invention is characterized in that in the above structure, the silicon nitride layer is under the polyimide layer in the interlayer insulator, and the conductive coating film has a portion which is in contact with the silicon nitride layer of the interlayer insulator at a portion where the conductive coating film overlaps with the semiconductor layer (or metal wiring line).

In the third or fourth aspect of the invention, if the semiconductor layer functioning as an electrode of the auxiliary capacitor is continuous with the source or drain of the thinfilm transistor, the circuit structure is simple and the occupied area can be decreased.

The dielectric of the auxiliary capacitor may be only the silicon nitride layer or a multilayer structure of the silicon nitride layer and other coating film (for example, silicon oxide). In the former case, the dielectric becomes thin, and by using the silicon nitride having large dielectric constant, larger capacitance can be obtained. In the third or fourth aspect of the invention, the thickness of silicon nitride layer is not larger than 1000 Å, preferably not larger than 500 Å.

In the present invention, it is possible to overlap the portion where the auxiliary capacitor is formed by the above structure with the portion where the auxiliary capacitor is formed by the method shown in FIGS. 10A to 10D. In that case, the auxiliary capacitor of the present invention overlaps with the capacitor wiring line. By this, since the auxiliary capacitor is formed into a multilayer configuration, it is possible to increase the capacitance without lowering an open rate.

When the present invention is practiced, a required step is only an etching step of the polyimide layer, and other steps of film forming, etching and the like are unnecessary. Thus, there is no difficulty in practicing the present invention.

DETAILED DESCRIPTION OF THE INVENTION

Embodiment 1

Manufacturing steps of this embodiment will be shown in FIGS. 1A to 1E. First, a silicon oxide film with a thickness of 3000 Å as an under layer film is formed on a glass substrate 1 by a sputtering method or a plasma CVD method, and then an amorphous silicon film with a thickness of 500 Å is formed by the plasma CVD method or a reduced pressure thermal CVD method. A crystalline silicon film is obtained by heating or laser light irradiation to the amorphous silicon film. The crystalline silicon film is etched so that an active layer 2 of a thin-film transistor is obtained.

Figures 1A, 1B, 1C, 1D, 1E:
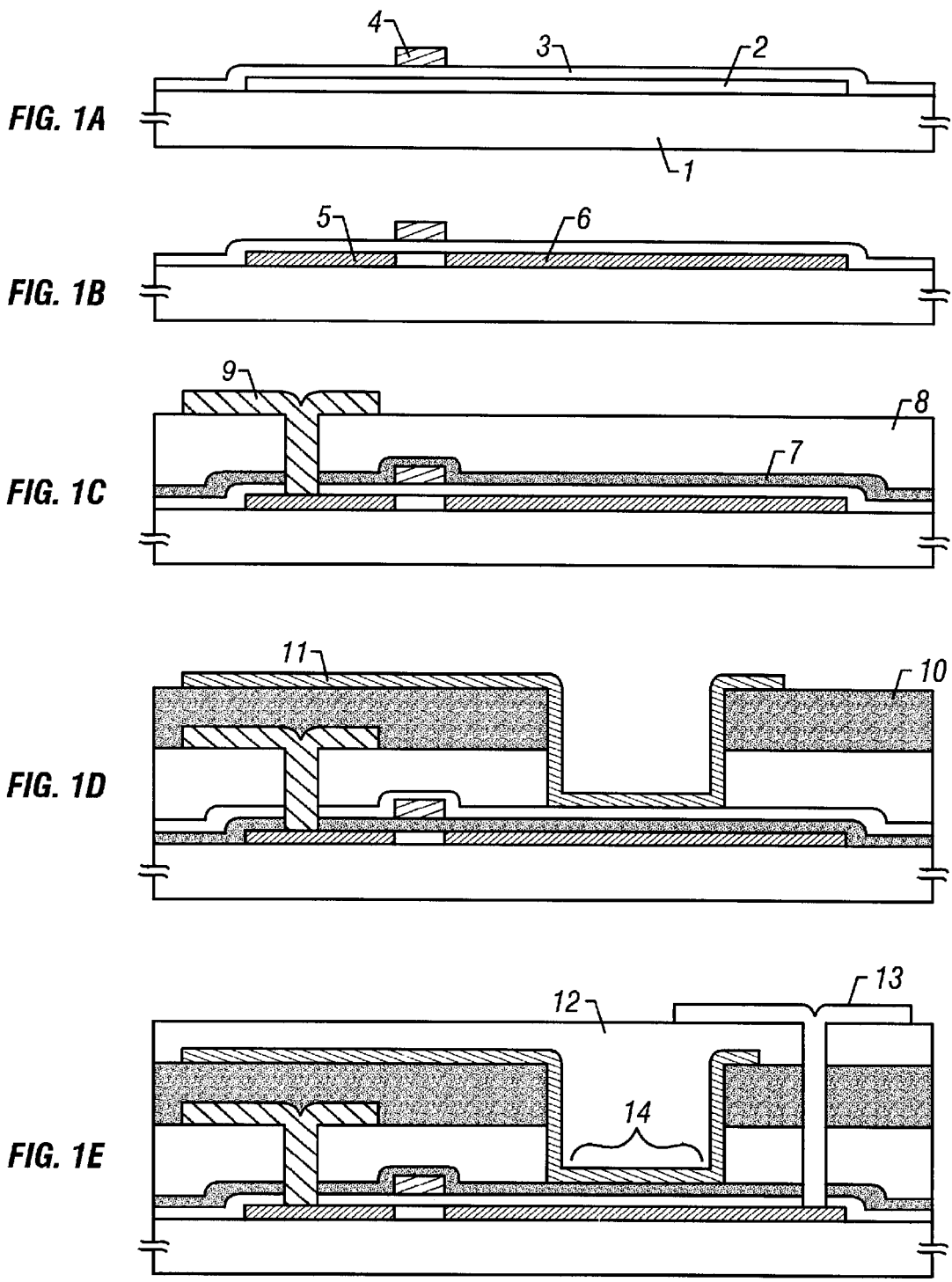
FIGS. 1A to 1E are sectional views showing manufacturing steps of an active matrix circuit of a first embodiment of the present invention.

Next, a silicon oxide film 3 with a thickness of 1000 Å as a gate insulating film is formed by the plasma CVD method, the low pressure thermal CVD method, or the sputtering method. A polycrystalline silicon film containing phosphorus and having a thickness of 5000 Å is formed by the reduced pressure CVD method, and is etched to obtain a gate wiring line 4. (FIG. 1A)

Next, by implantation of impurity ions of phosphorus giving an N-type with a dose of $5 \times 10^{14}$ to $5 \times 10^{15}$ atoms/cm$^3$, a source 5 and a drain 6 are formed. Any of them become an N-type. After implantation of impurity ions, the region where the impurity ions were implanted is activated by carrying out heat treatment, laser light irradiation, or intense light irradiation. (FIG. 1B)

Next, a silicon nitride film 7 is formed by the plasma CVD method using silane and ammonia, silane and N$_2$O, or silane, ammonia and N$_2$O. The thickness of the silicon nitride film 7 is 250 to 1000 Å, and 500 Å in this embodiment. The film forming method of the silicon nitride may be a method using dichlorsilane and ammonia. Also, the low pressure thermal CVD method or photo CVD method may be used.

After formation of the silicon nitride film, by carrying out a heat treatment at a temperature of 350° C. for two hours, annealing is conducted to the surfaces of the silicon oxide film 3, the source 5 and drain 6 damaged by the previous impurity ion implantation. In this step, hydrogen is diffused from the silicon nitride film 7, so that defects in the silicon oxide film 3 and the surfaces of the source 5 and drain 6 are removed. Further, hydrogen is diffused into a channel forming region under the gate wiring 4 so that defects in the region are removed.

Subsequently, by a spin coating method, a polyimide layer 8 with a thickness of at least 8000 Å, preferable 1.5 μm is formed. The surface of the polyimide layer is made flat. Thus, an interlayer insulator including the silicon nitride layer 7 and the polyimide layer 8 are formed.

Thereafter, the polyimide layer 8, the silicon nitride layer 7, and the silicon oxide film 3 are etched to form a contact hole reaching to the source 5. Further, an aluminum film with a thickness of 6000 Å is formed by the sputtering method, and is etched to form a data wiring line 9. The data wiring line 9 comes in contact with the source 5. (FIG. 1C)

Figure 5A:
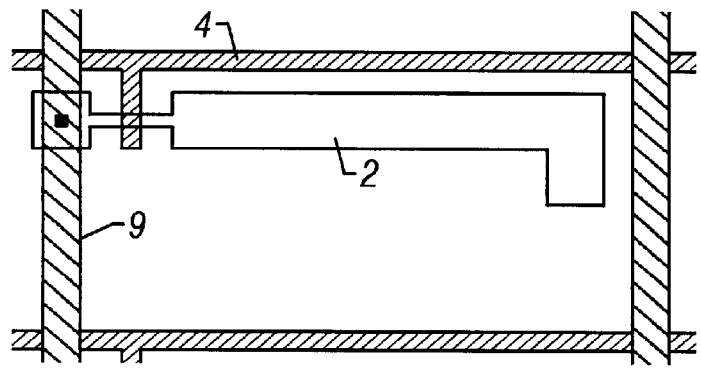
FIGS. 5A and 5B are top views showing manufacturing steps of the active matrix circuit of the first embodiment of the present invention.

FIG. 5A shows the state of the circuit obtained in these steps seen from the above. Reference numerals correspond to those in FIGS. 1A and 1C. (FIG. 5A)

Next, a polyimide layer 10 is formed as a second interlayer insulator with a thickness of 8000 Å. Then, the polyimide layers 8 and 10 are etched to form a hole for an auxiliary capacitor. Further, a titanium film with a thickness of 1000 Å is formed by the sputtering method. Of course, a metal film such as a chromium film or an aluminum film may be used. The titanium film is etched to form a black matrix 11. The black matrix is formed so as to cover the previously formed hole for the auxiliary capacitor. (FIG. 1D)

Figure 5B:
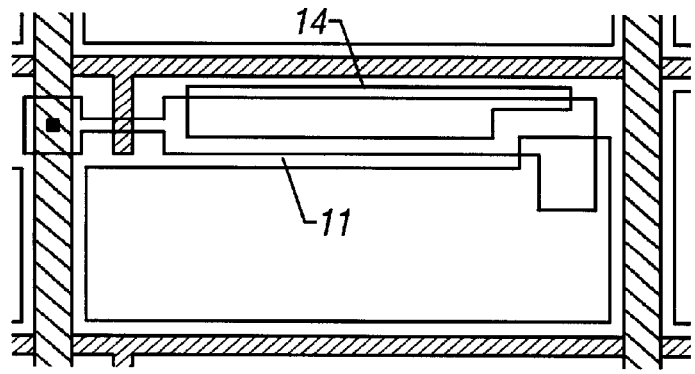

FIG. 5B shows the hole 14 for the auxiliary capacitor and the black matrix 11 obtained in these steps seen from the above. Reference numerals correspond to those in FIGS. 1D and 1BE. The auxiliary capacitor is formed at a portion where the black matrix 11 overlaps with the hole 14 for the auxiliary capacitor. (FIG. 5B)

Further, as a third interlayer insulator, a polyimide film 12 with a thickness of 5000 Å is formed, and the polyimide films 8, 10 and 12, the silicon nitride layer 7, and the silicon oxide film 3 are etched so that a contact hole reaching to the drain 6 is formed. Further, an ITO (Indium Tin Oxide) film with a thickness of 1000 Å is formed by the sputtering method, and is etched to form a pixel electrode 13 (FIG. 1E).

In this way, an active matrix circuit is completed. When the insulating layer is formed by the polyimide film as in this embodiment, flattening is easy and remarkable effects are obtained. In this embodiment, the auxiliary capacitor is obtained at the portion 14 where the black matrix 11 overlaps with the drain 6, and the dielectric is a multilayer film consisting of the silicon oxide film 3 used as the gate insulating film and the silicon nitride layer 7. Of course, since the silicon oxide film 3 is considerably damaged by the subsequent doping step, although it does not have such resistance as to be used as the gate insulating film, the insulation property thereof is sufficient.

Embodiment 2

Figure 2A:
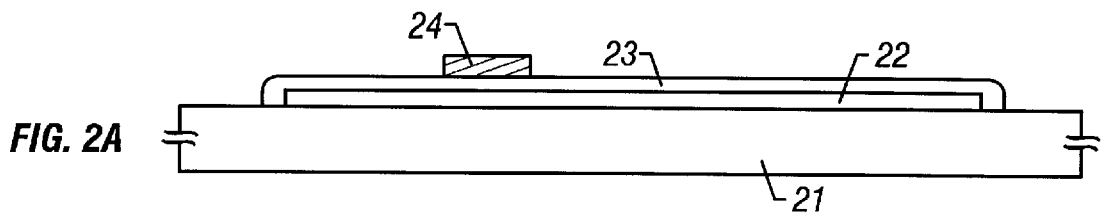
FIGS. 2A to 2E are sectional views showing manufacturing steps of an active matrix circuit of a second embodiment of the present invention.

Manufacturing steps of this embodiment will be shown in FIGS. 2A to 2E. First, an active layer 22 of a crystalline silicon film with a thickness of 1000 Å is formed on a quartz substrate 21 coated with an under layer film. The active layer is thermally oxidized so that a silicon oxide film 23 with a thickness of 1000 Å is obtained on the surface thereof. The silicon oxide film 23 functions as a gate insulating film. Further, a polycrystalline silicon film containing phosphorus with a thickness of 5000 Å is formed by the low pressure CVD method, and is etched to obtain a gate wiring line 24. (FIG. 2A)

Next, impurity ions of phosphorus giving an N-type with a dose of $5 \times 10^{12}$ to $5 \times 10^{13}$ atoms/cm$^3$ is implanted, so that a low concentration impurity region 28 is obtained. Further, by using a well known side wall forming technique employing an anisotropic etching technique, a side wall 25 of an insulator is obtained at a side surface of the gate wiring line 24. At that time, the silicon oxide film 23 is etched except the portion under the gate wiring 24 and the side wall 25 so that only the gate insulating film 26 remains.

Figure 2B:
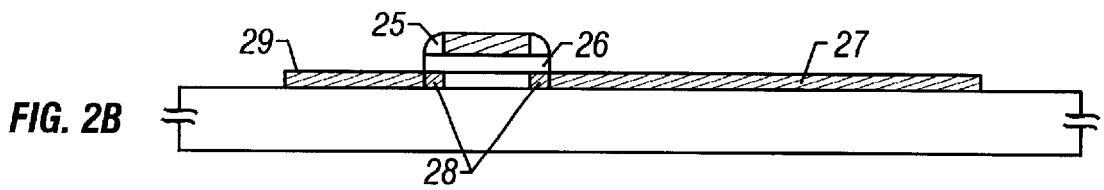

In this state, ions of phosphorus with a dose of $5 \times 10^{14}$ to $5 \times 10^{15}$ atoms/cm$^3$ are implanted, so that a source 29 and a drain 27 are formed. After implantation of the impurity ions, a heat treatment is carried out so that the region where the impurity ions were injected is activated. The details of the above doping step are disclosed in, for example, Japanese Patent Unexamined Publication No. 8-18055. (FIG. 2B)

Figure 2C:
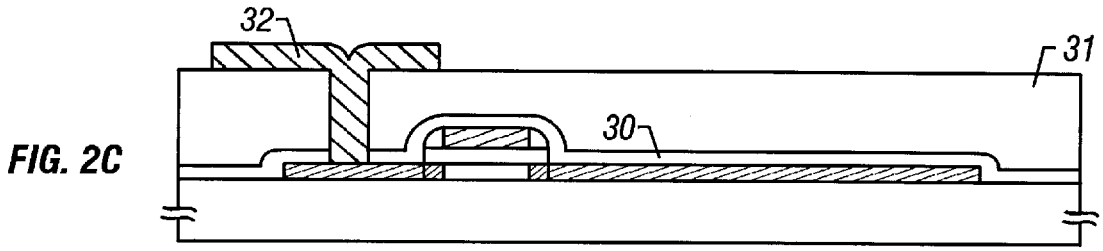

Next, a silicon nitride layer 30 and a polyimide layer 31 are formed under the same conditions as the first embodiment. Unlike the first embodiment, in this embodiment, the silicon nitride layer 30 is brought into direct contact with the source 29 and the drain 27. Next, the silicon nitride layer 30 and the polyimide layer 31 are etched to form a contact hole reaching to the source 29. Further, an aluminum film with a thickness of 6000 Å is formed by the sputtering method, and is etched to form a data wiring line 32. The data wiring line 32 is brought into contact with the source 29. The state of the circuit obtained in these steps seen from the above is equivalent to that shown in FIG. 5A. (FIG. 2C)

Figure 2D:
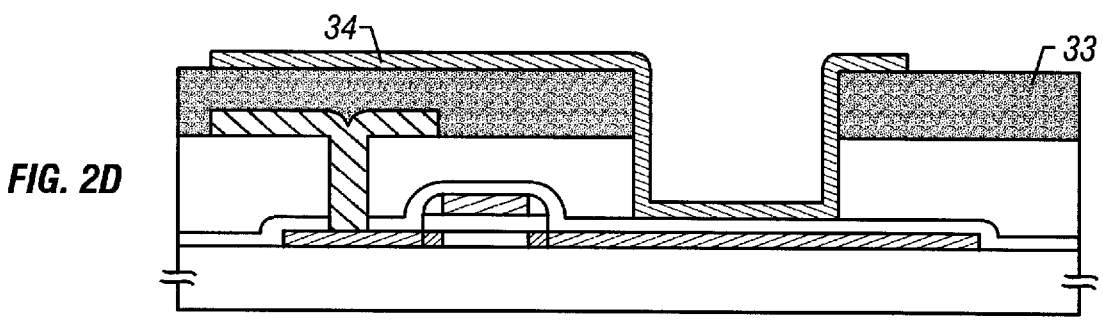

Next, a polyimide layer 33 is formed as a second interlayer insulator with a thickness of 8000 Å. Then, the polyimide layers 31 and 33 are etched to form a hole for an auxiliary capacitor. Further, a titanium film with a thickness of 1000 Å is formed by the sputtering method, and is etched to form a black matrix 34. The state of the circuit obtained in these steps seen from the above is equivalent to that shown in FIG. 5B. (FIG. 2D)

Figure 2E:
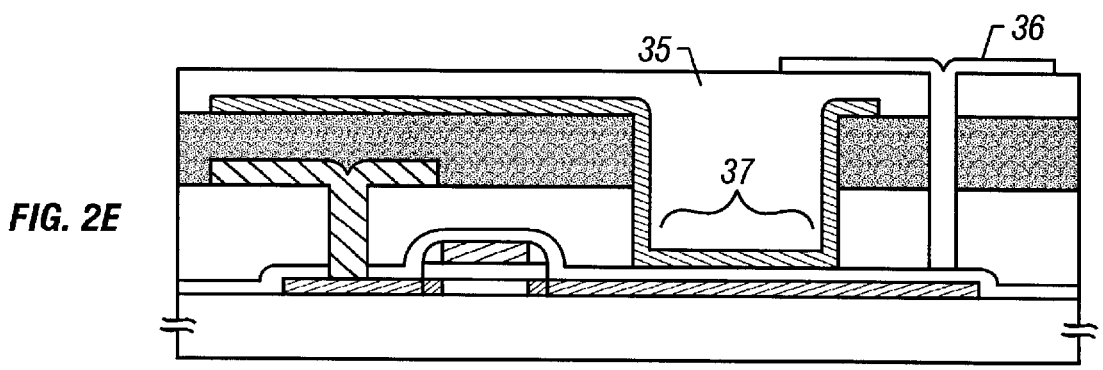
Figure 3A:
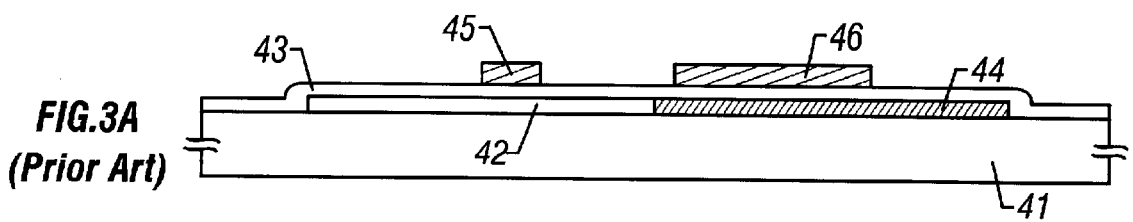
FIGS. 3A to 3E are sectional views showing manufacturing steps of an active matrix circuit using conventional top-gate type thin-film transistors.
Figure 3B:
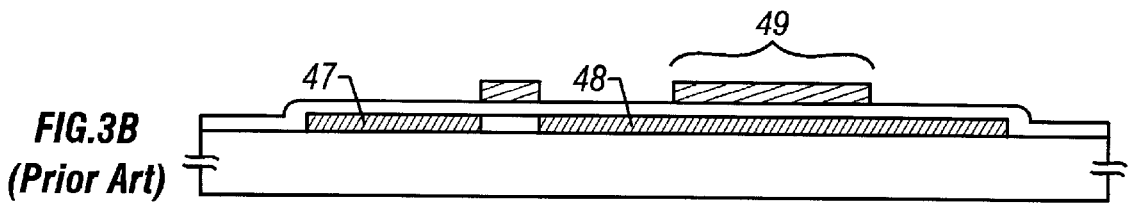
Figure 3C:
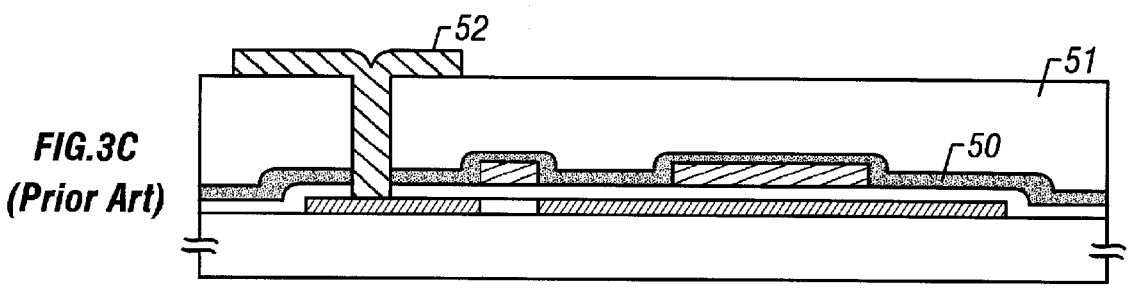
Figure 3D:
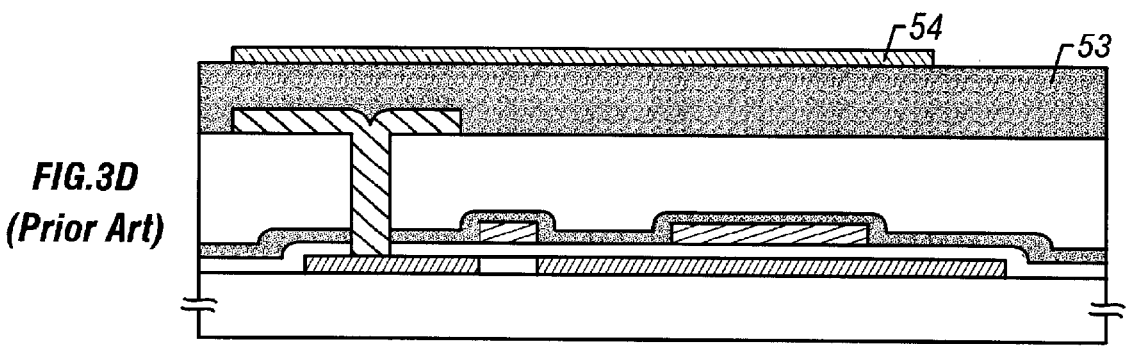
Figure 3E:
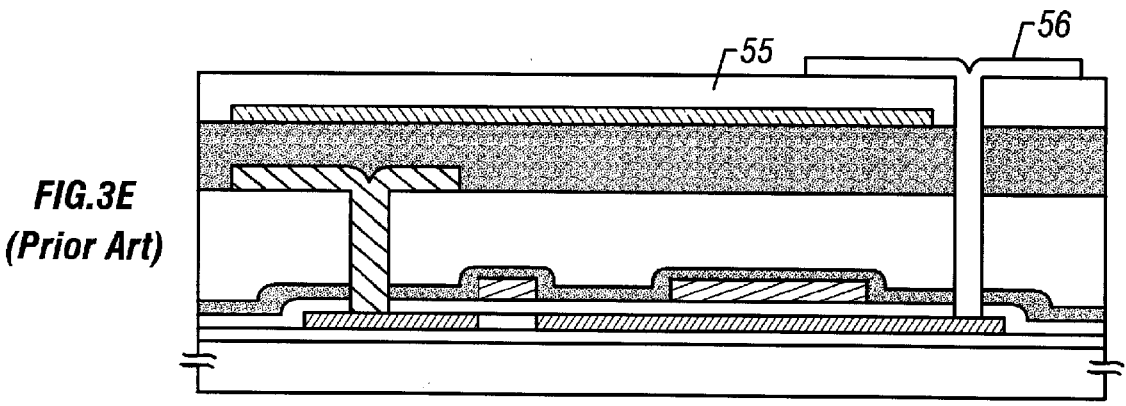
Figure 4:
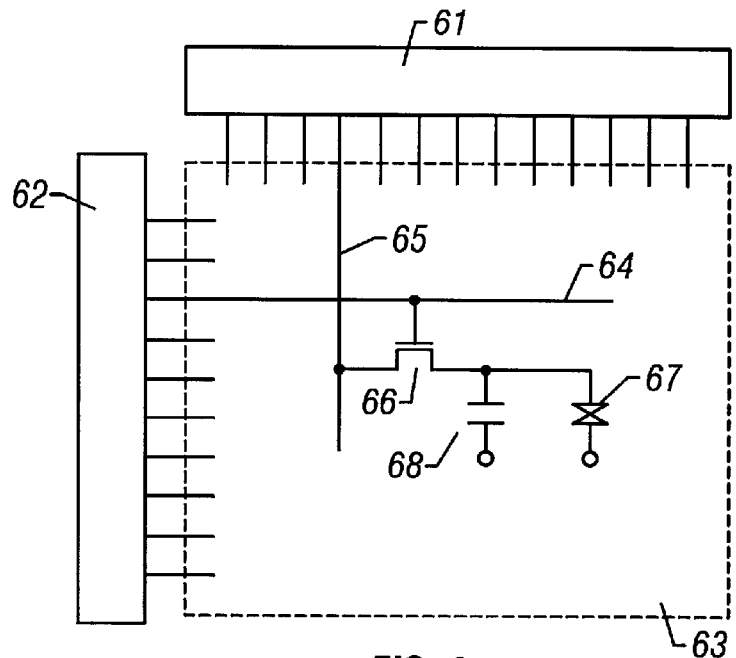
FIG. 4 is a circuit diagram of a general active matrix circuit.

Further, a polyimide film 35 with a thickness of 5000 Å is formed as a third interlayer insulator, and the polyimide films 31, 33 and 35 and the silicon nitride layer 30 are etched to form a contact hole reaching to the drain 27. Further, an ITO (Indium Tin Oxide) film with a thickness of 1000 Å is formed by the sputtering method, and is etched to form a pixel electrode 36. (FIG. 2E)

In this way, an active matrix circuit is completed. In this embodiment, the auxiliary capacitor is obtained at a portion 37 where the black matrix overlaps with the drain 27, and a dielectric of the auxiliary capacitor is the silicon nitride layer 30. Since the silicon nitride has high dielectric constant, large capacitance is obtained with a small area.

Embodiment 3

Manufacturing steps of this embodiment will be shown in FIGS. 6A to 6D. First, a gate wiring line 102 and a capacitor wiring line 103 are formed of a tantalum film with a thickness of 4000 Å on a glass substrate 101 having a silicon oxide film with a thickness of 3000 Å formed by the sputtering method or plasma CVD method as an under layer film. An oxide coating film may be formed on the surfaces of the wiring lines by anodic oxidation. By this, the insulation property can be increased.

Next, a silicon oxide film 104 as a gate insulating film with a thickness of 1000 Å is formed by the plasma CVD method, the low pressure thermal CVD method, or the sputtering method. The gate insulating film may be a multilayer film of a silicon nitride film and a silicon oxide film.

Further, an amorphous silicon film with a thickness of 500 Å is formed by the plasma CVD method or the low pressure thermal CVD method. This film may be changed into a crystalline film by heating or laser light irradiation. The thus obtained amorphous silicon film (or crystalline silicon film) is etched to obtain a semiconductor layer (active layer) 105 of a thinfilm transistor.

Figure 6A:
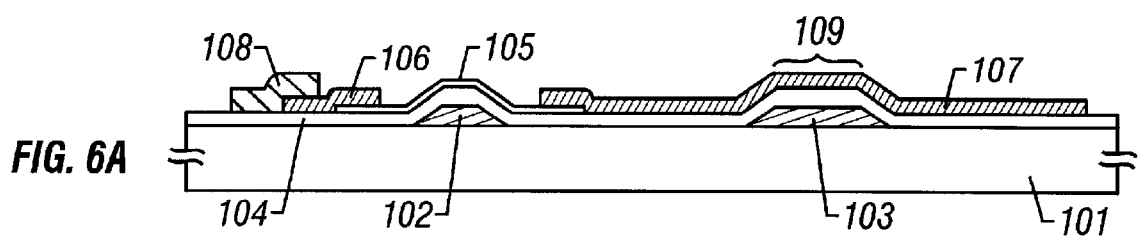
FIGS. 6A to 6D are sectional views showing manufacturing steps of an active matrix circuit of a third embodiment of the present invention.

Next, a polycrystalline silicon film containing phosphorus with a thickness of 5000 Å is formed by the low pressure CVD method, and is etched to obtain a source 106 and a drain 107. Further, by using an aluminum film with a thickness of 6000 Å, a data wiring line 108 is obtained. In the above, a first auxiliary capacitor 109 including a dielectric of the gate insulating film 104 is formed between the capacitor wiring line 103 and the drain 107. (FIG. 6A)

Figure 8A:
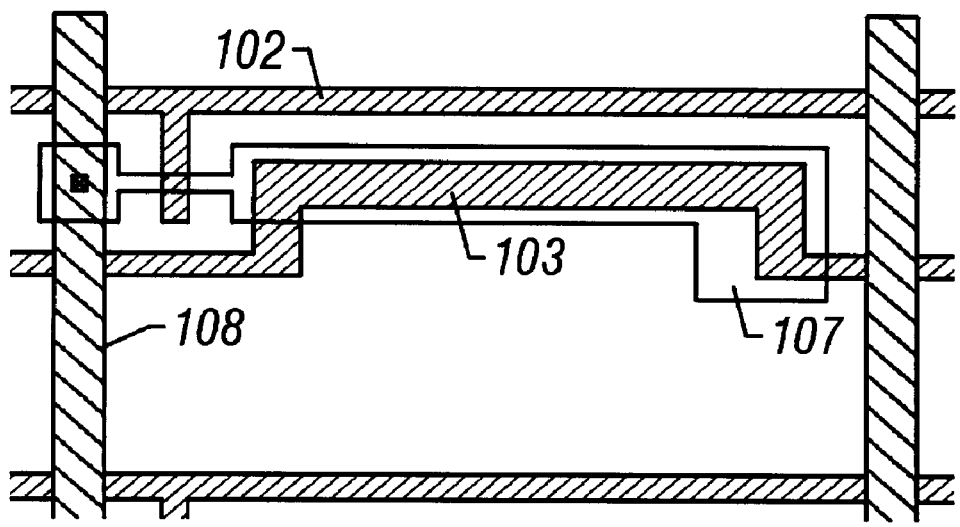
FIGS. 8A and 8B are top views showing manufacturing steps of the active matrix circuit of the third embodiment of the present invention.

FIG. 8A shows the state of the circuit obtained in these steps seen from the above. Reference numerals correspond to those in FIG. 6A.

Next, a silicon nitride film 110 is formed by the plasma CVD method using silane and ammonia, silane and N$_2$O, or silane, ammonia and N$_2$O. This silicon nitride film 110 has a thickness of 250 to 1000 Å, and 500 Å in this embodiment. The silicon nitride film may be formed by a method using dichlorsilane and ammonia. Also, the reduced pressure thermal CVD method or photo CVD method may be used.

Figure 6B:
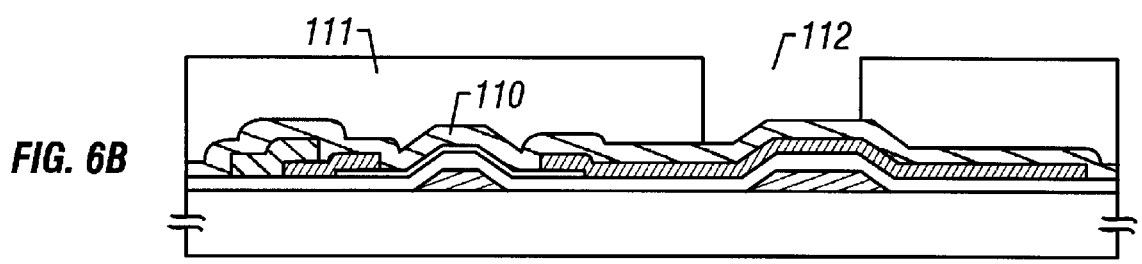

Subsequently, by a spin coating method, a polyimide layer 111 with a thickness of at least 8000 Å, preferably 1.5 μm is formed. The surface of the polyimide layer is made flat. In this way, a first interlayer insulator consisting of the silicon nitride layer 110 and the polyimide layer 111 is formed. Then, the polyimide layer 111 is etched to form a hole 112 for an auxiliary capacitor. (FIG. 6B)

Further, a titanium film with a thickness of 1000 Å is formed by the sputtering method. Of course, a metal film such as a chromium film or an aluminum film may be used.

Figure 6C:
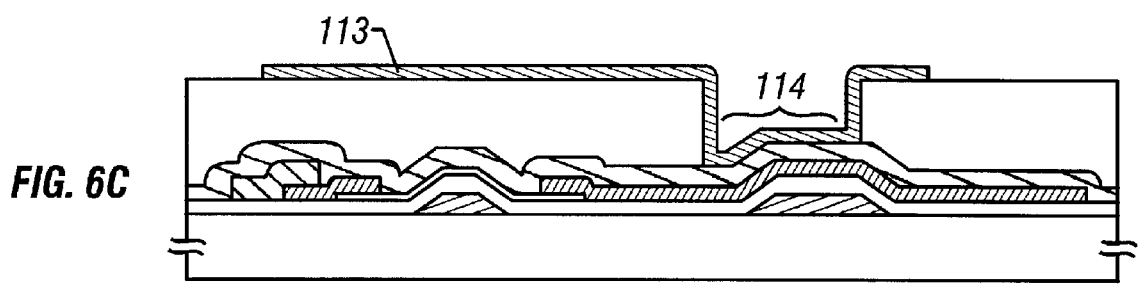

Then, the titanium film is etched to form a black matrix 113. The black matrix is formed so as to cover the previously formed hole 112 for the auxiliary capacitor. In this way, at the hole 112 for the auxiliary capacitor, a second auxiliary capacitor 114 with a dielectric of the silicon nitride layer 110 is formed between the black matrix 113 and the drain 107 (FIG. 6C).

Figure 8B:
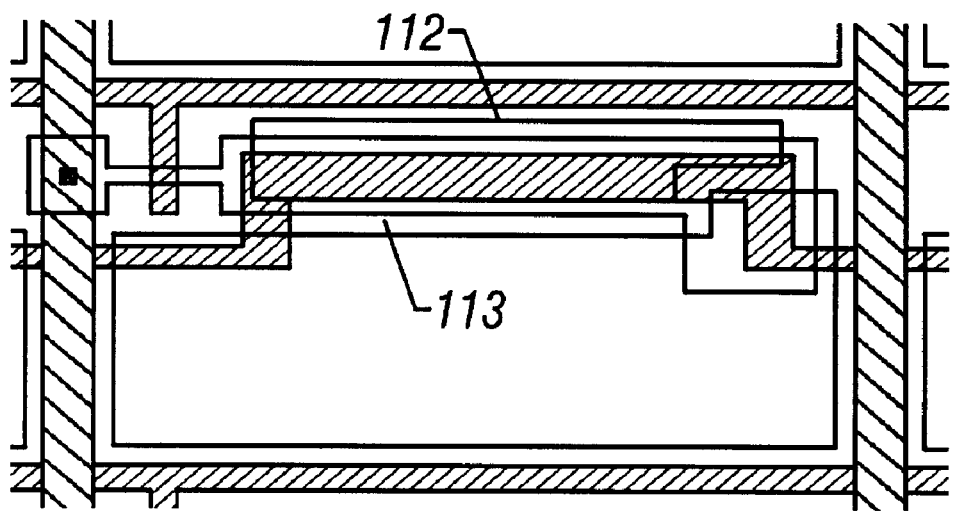

FIG. 8B shows the state of the hole 112 for the auxiliary capacitor and the black matrix 113 obtained in these steps seen from the above. Reference numerals correspond to those in FIGS. 6B and 6C. A second auxiliary capacitor is formed at a portion where the black matrix 113 overlaps with the hole 112 for the auxiliary capacitor. (FIG. 8B)

Figure 6D:
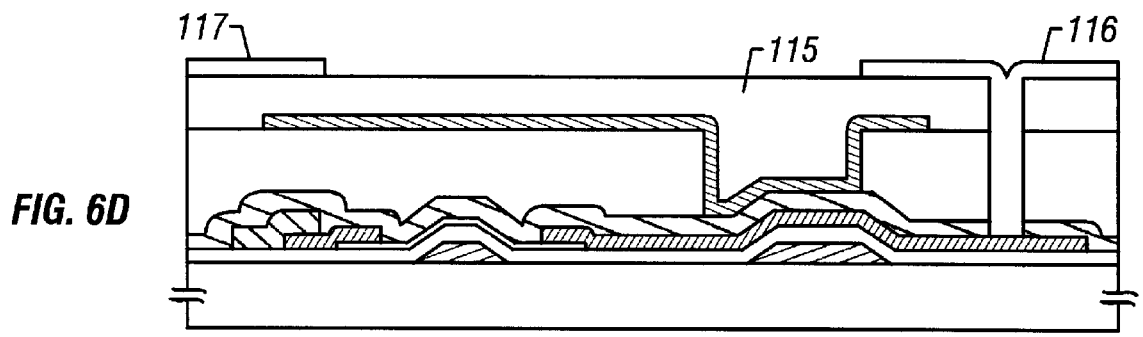

Further, as a second interlayer insulator, a polyimide film 115 with a thickness of 5000 Å is formed, and the polyimide films 111 and 115 and the silicon nitride layer 110 are etched to form a contact hole reaching to the drain 107. Further, an ITO (Indium Tin Oxide) film with a thickness of 1000 Å is formed by the sputtering method, and is etched to form pixel electrodes 116 and 117. (FIG. 6D)

In this way, an active matrix circuit is completed. When the insulating layer is formed by the polyimide film as in this embodiment, flattening is easy and remarkable effects can be obtained.

Embodiment 4

Manufacturing steps of this embodiment will be shown in FIGS. 7A to 7E. First, a gate wiring line 122 and a capacitor wiring line 123 are formed of an aluminum film with a thickness of 3000 Å on a glass substrate 121 coated with an underlying film. An oxide coating film may be formed on the surface of these wiring lines by anodic oxidation. By this, the insulation property can be increased. Next, a silicon oxide film 124 as a gate insulating film with a thickness of 1000 Å is formed by the plasma CVD method. The gate insulating film may be a multilayer film of a silicon nitride film and a silicon oxide film.

Further, an amorphous silicon film with a thickness of 500 Å is formed by the plasma CVD method or the low pressure thermal CVD method. The amorphous silicon film may be changed into a crystalline silicon film by heating or laser light irradiation. The thus obtained amorphous silicon film (or crystalline silicon film) is etched to obtain a semiconductor layer (active layer) 125 of a thin-film transistor.

Figure 7A:
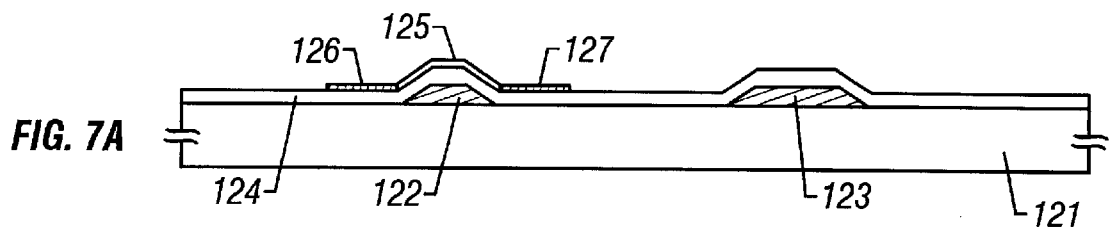
FIGS. 7A to 7E are sectional views showing manufacturing steps of an active matrix circuit of a fourth embodiment of the present invention.

Next, impurity ions of phosphorus giving N-type with a dose of $5 \times 10^{14}$ to $5 \times 10^{15}$ atoms/cm$^3$ is selectively implanted into the semiconductor layer 125, so that a source 126 and a drain 127 are obtained. After implantation of the impurity ions, the region where the impurity ions were implanted may be activated by a heat treatment, laser light irradiation or the like. (FIG. 7A)

Figure 7B:
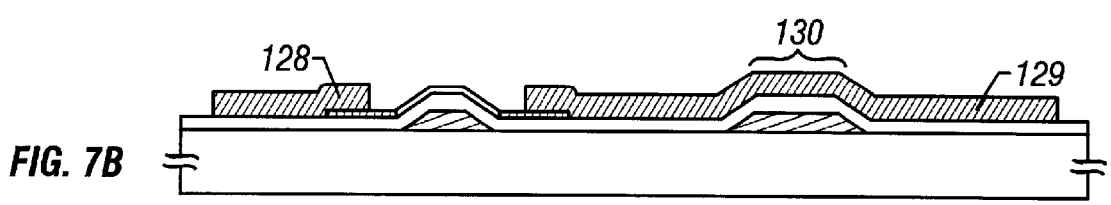

Next, a data wiring line 128 and a wiring line (drain wiring line) 129 connected to the drain are obtained by using an aluminum film with a thickness of 6000 Å. In the above, a first auxiliary capacitor 130 including a dielectric of the gate insulating film 124 is formed between the capacitor wiring line 123 and the drain wiring line 129. (FIG. 7B)

Figure 7C:
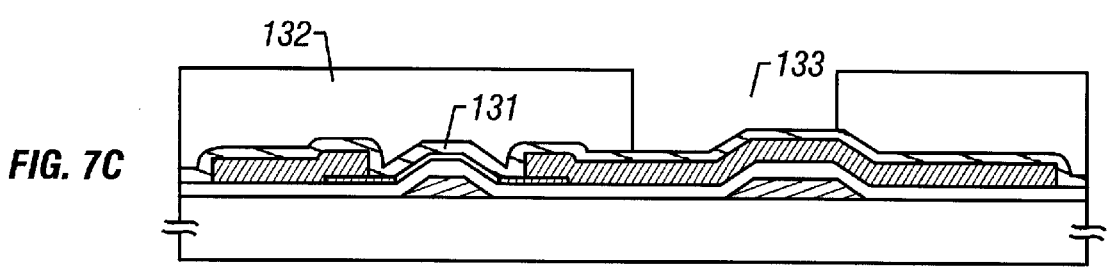

Next, a silicon nitride layer 131 and a polyimide layer 132 are formed under the same conditions as in the third embodiment. Next, the polyimide layer 132 is etched to form a hole 133 for an auxiliary capacitor. (FIG. 7C)

Figure 7D:
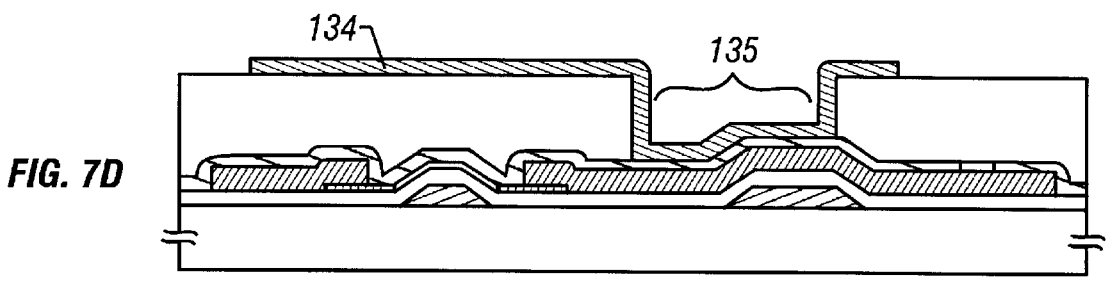

Further, a titanium film with a thickness of 1000 Å is formed by the sputtering method. Of course, a metal film such as a chromium film or an aluminum film may be used. Then, the titanium film is etched to form a black matrix 134. In this way, at the hole 133 for the auxiliary capacitor, a second auxiliary capacitor 135 including a dielectric of the silicon nitride layer 131 is formed between the black matrix 134 and the drain wiring line 129. (FIG. 7D)

Figure 7E:
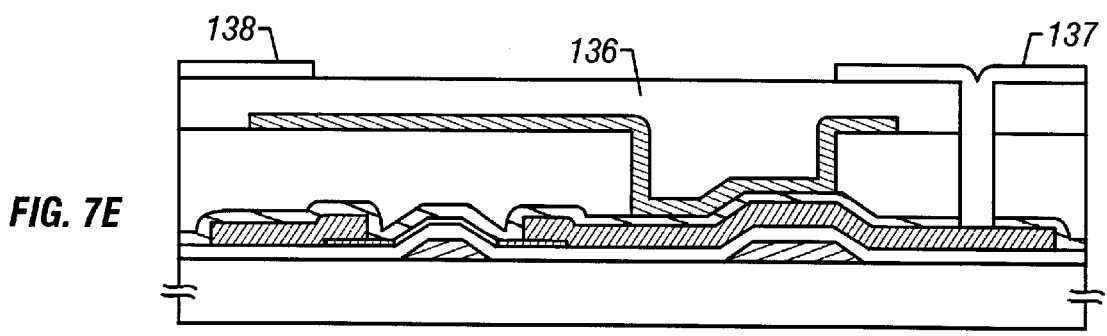

Further, a polyimide film 136 with a thickness of 5000 Å is formed as a second interlayer insulator, and the polyimide films 132 and 136, and the silicon nitride layer 131 are etched to form a contact hole reaching to the drain wiring line 129. Further, an ITO (Indium Tin Oxide) film with a thickness of 1000 Å is formed, and is etched to form pixel electrodes 137 and 138. (FIG. 7E)

Embodiment 5

Manufacturing steps of this embodiment will be shown in FIGS. 9A to 9E. First, a gate wiring line 152 and a capacitor wiring line 153 are formed of a tantalum film with a thickness of 4000 Å on a glass substrate 151 coated with an underlying film. An oxide coating film may be formed on the surfaces of these wiring lines by anodic oxidation. By this, the insulation property can be increased. Next, a silicon oxide film 154 with a thickness of 1000 Å is formed as a gate insulating film by the plasma CVD method. The gate insulating film may be a multilayer film of a silicon nitride film and a silicon oxide film.

Further, an amorphous silicon film with a thickness of 500 Å is formed by the plasma CVD method. The thus obtained amorphous silicon film is etched to obtain a semiconductor layer (active layer) 155 of a thin-film transistor.

Figure 9A:
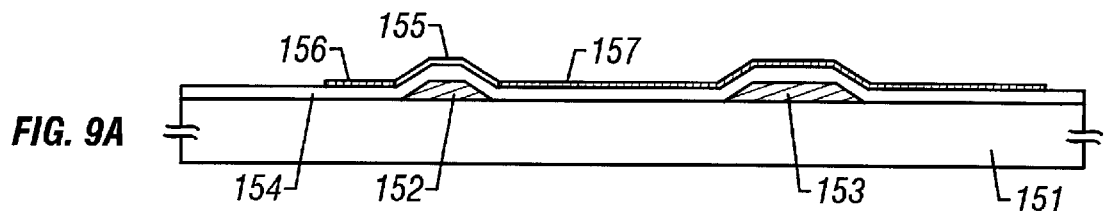
FIGS. 9A to 9E are sectional views showing manufacturing steps of an active matrix circuit of a fifth embodiment of the present invention.

Next, impurity ions of phosphorus giving an N-type with a dose of $5 \times 10^{14}$ to $5 \times 10^{15}$ atoms/cm$^3$ are selectively implanted into the semiconductor layer 155, so that a source 156 and a drain 157 are obtained. After implantation of the impurity ions, the region where the impurity ions were implanted may be activated by a heat treatment, laser irradiation or the like. (FIG. 9A)

Figure 9B:
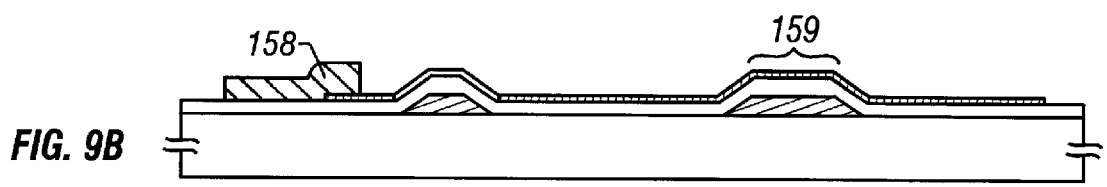

Next, a data wiring line 158 is obtained by using an aluminum film with a thickness of 6000 Å. In the above, the semiconductor layer 155 is formed so as to overlap with the capacitor wiring line 153. Accordingly, a first auxiliary capacitor 159 with a dielectric of the gate insulating film 154 is formed between the capacitor wiring line 153 and the drain 157. (FIG. 9B)

Figure 9C:
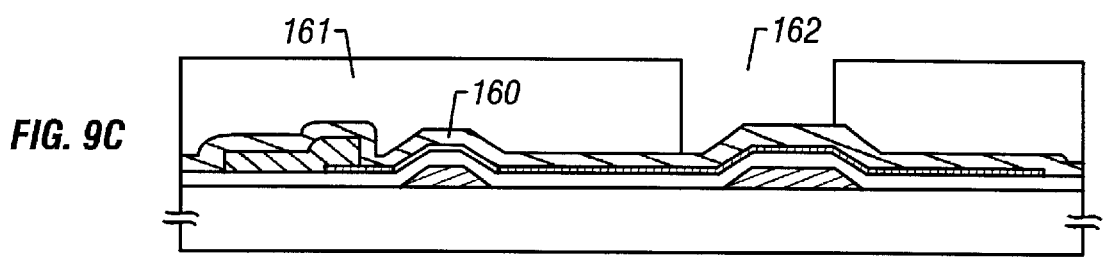

Next, a silicon nitride layer 160 and a polyimide layer 161 are formed under the same conditions as in the third embodiment. Next, the polyimide layer 161 is etched to form a hole 162 for an auxiliary capacitor. (FIG. 9C)

Figure 9D:
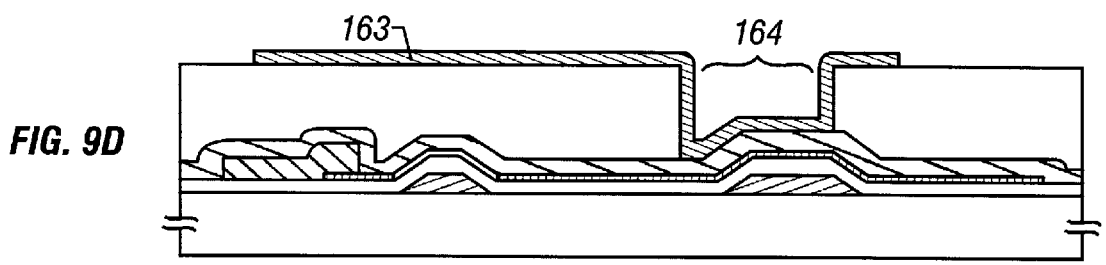

Further, a titanium film with a thickness of 1000 Å is formed by the sputtering method, and the titanium film is etched to form a black matrix 163. In this way, at the hole 162 for the auxiliary capacitor, a second auxiliary capacitor including a dielectric of the silicon nitride layer 160 is formed between the black matrix 163 and the drain 157. (FIG. 9D)

Figure 9E:
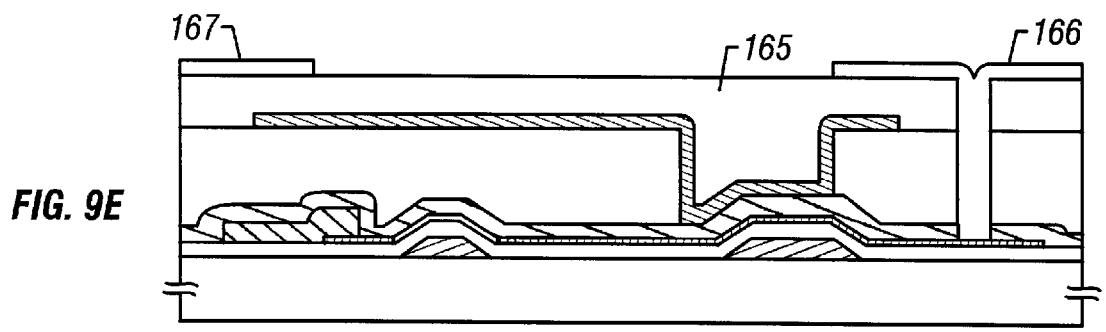
Figure 10A:
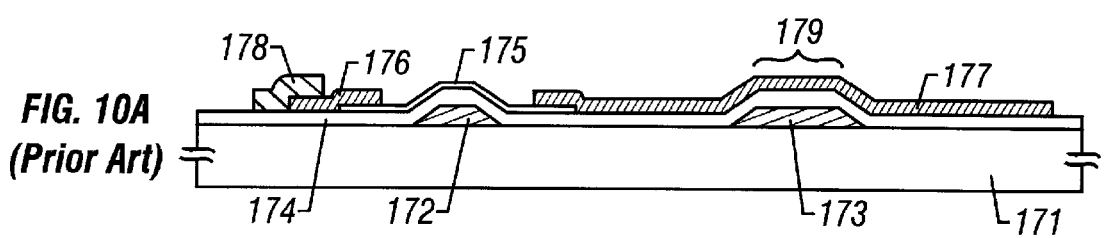
FIGS. 10A to 10D are sectional views showing manufacturing steps of an active matrix circuit using conventional bottom-gate type thin-film transistors.
Figure 10B:
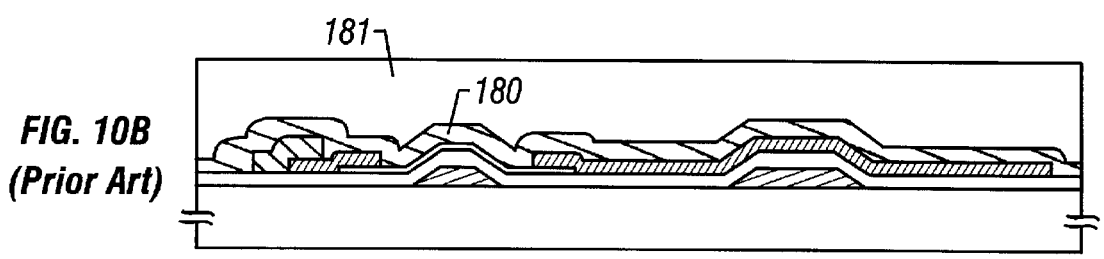
Figure 10C:
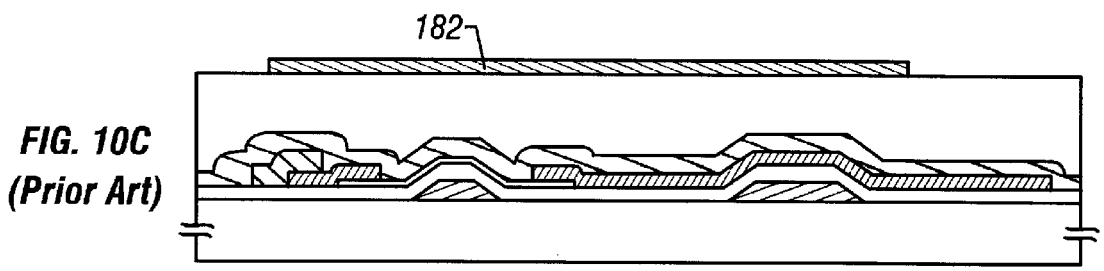
Figure 10D:
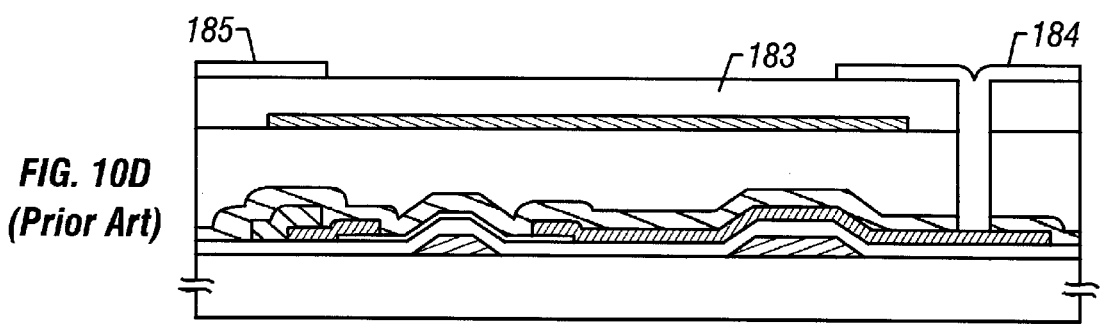

Further, a polyimide film 165 with a thickness of 5000 Å is formed as a second interlayer insulator, and the polyimide films 161 and 165 and the silicon nitride layer 160 are etched so that a contact hole reaching to the drain 157 is formed. Further, an ITO (Indium Tin Oxide) film with a thickness of 1000 Å is formed by the sputtering method, and is etched to form pixel electrodes 166 and 167 (FIG. 9E).

As is apparent from the foregoing description, it has become clear that in an active matrix circuit using top-gate type thin-film transistors, when an auxiliary capacitor is formed of electrodes of an N-type or P-type active layer and a conductive coating film used as a black matrix, and a dielectric of a silicon nitride layer formed as a passivation film, conventional problems can be solved.

Also, it has become clear that in an active matrix circuit using bottom-gate type thin-film transistors, when an auxiliary capacitor is formed of electrodes of an N-type or P-type semiconductor layer or a wiring line connected thereto and a conductive coating film used as a black matrix, and a dielectric of a silicon nitride layer formed as a passivation film, conventional problems can be solved.

As described above, the present invention is useful in industry.

What is claimed is:

1. An active matrix type display circuit having at least one top-gate type thin film transistor, comprising:
   an N-type or a P-type active layer;
   a conductive film functioning as a black matrix and kept at a constant potential;
   a gate wiring line and a data wiring line;
   a first interlayer insulator including a silicon nitride layer and an organic resin layer, and being located between said gate wiring line and said data wiring line; and
   a second interlayer insulator located between said data wiring line and said conductive film,
   wherein said silicon nitride layer is located under said organic resin layer in said first interlayer insulator; and
   wherein an auxiliary capacitor is constituted by both electrodes formed of said active layer and said conductive film, and a dielectric formed of at least said silicon nitride layer of said first interlayer insulator, said auxiliary capacitor being located at a portion where said organic resin layer of said first interlayer insulator and said second interlayer insulator have been etched.

2. An active matrix type display circuit as claimed in claim 1, wherein said active layer is continuous with a source or a drain of said thin film transistor.

3. An active matrix type display circuit as claimed in claim 1, wherein said auxiliary capacitor includes said dielectric formed of only said silicon nitride layer of said first interlayer insulator.

4. An active matrix type display circuit as claimed in claim 1, wherein a thickness of said silicon nitride layer is 1000 Å or less.

5. An active matrix type display circuit as claimed in claim 1, wherein said organic resin layer includes polyimide.

6. An active matrix type display circuit having at least one top-gate type thin film transistor, comprising:
   an N-type or a P-type active layer;
   a conductive film functioning as a black matrix and kept at a constant potential;
   a gate wiring line and a data wiring line;
   a first interlayer insulator including a silicon nitride layer and an organic resin layer and being located between said gate wiring line and said data wiring line; and
   a second interlayer insulator located between said data wiring line and said conductive film,
   wherein said silicon nitride layer is located under said organic resin layer in said first interlayer insulator; and
   wherein said conductive film is in contact with said silicon nitride layer of said first interlayer insulator at a portion where said conductive film overlaps with said active layer.

7. An active matrix type display circuit as claimed in claim 6, wherein said active layer is continuous with a source or a drain of said thin film transistor.

8. An active matrix type display circuit as claimed in claim 6, wherein a thickness of said silicon nitride layer is 1000 Å or less.

9. An active matrix type display circuit as claimed in claim 6, wherein said organic resin layer includes polyimide.

10. An active matrix type display circuit having at least one bottom-gate type thin film transistor, comprising:
    a gate wiring line and a data wiring line;
    an N-type or a P-type semiconductor layer;
    metal wiring line in the same layer as said data wiring line connected to said N-type or P-type semiconductor layer;
    a conductive film functioning as a black matrix and kept at a constant potential; and
    an interlayer insulator including a silicon nitride layer and an organic resin layer and being located between said conductive film and said data wiring line,
    wherein said silicon nitride layer is located under said organic resin layer in said interlayer insulator; and
    wherein an auxiliary capacitor is constituted by both electrodes formed of said semiconductor layer and said conductive film, or said metal wiring line and said conductive film, and a dielectric formed of at least said silicon nitride layer of said interlayer insulator, said auxiliary capacitor being located at a portion where said organic resin layer of said interlayer insulator has been etched.

11. An active matrix type display circuit as claimed in claim 10, wherein said semiconductor layer is continuous with a source or a drain of said thin film transistor.

12. An active matrix type display circuit as claimed in claim 10, wherein said auxiliary capacitor includes said dielectric formed of only said silicon nitride layer of said interlayer insulator.

13. An active matrix type display circuit as claimed in claim 10, wherein a thickness of said silicon nitride layer is 1000 Å or less.

14. An active matrix type display circuit as claimed in claim 10, wherein a portion where said resin layer of said interlayer insulator has been etched, overlaps with a wiring line in the same layer as said gate wiring line.

15. An active matrix type display circuit as claimed in claim 10, wherein a portion where said conductive film is in contact with said silicon nitride layer of said interlayer insulator, overlaps with a wiring line of the same layer as said gate wiring line.

16. An active matrix type display circuit having at least one bottom-gate type thin film transistor, comprising:
    a gate wiring line and a data wiring line;
    an N-type or a P-type semiconductor layer;
    metal wiring line in the same layer as said data wiring line connected to said N-type or P-type semiconductor layer;
    a conductive film functioning as a black matrix and kept at a constant potential; and
    an interlayer insulator including a silicon nitride layer and an organic resin layer and being located between said conductive film and said data wiring line,
    wherein said silicon nitride layer is located under said organic resin layer in said interlayer insulator; and
    wherein said conductive film is in contact with said silicon nitride layer of said interlayer insulator at a portion where said conductive film overlaps with said semiconductor layer or said metal wiring line.

17. An active matrix type display circuit as claimed in claim 16, wherein said semiconductor layer is continuous with a source or a drain of said thin film transistor.

18. An active matrix type display circuit as claimed in claim 16, wherein a thickness of said silicon nitride layer is 1000 Å or less.

19. An active matrix type display circuit comprising:
    a semiconductor film comprising silicon on an insulating surface, said semiconductor film having at least a source, a drain and a low concentration impurity region between said source and said drain;

a gate insulating film on said semiconductor film;

a gate electrode on said gate insulating film;

a first interlayer insulator over said gate electrode, said first interlayer insulator comprising a silicon nitride layer and an organic resin layer thereon;

a data wiring line on said first interlayer insulator and in contact with one of said source and said drain through a contact hole formed in said first interlayer insulator and said gate insulating film;

a second interlayer insulator on said first interlayer insulator and said data wiring line;

a conductive film comprising titanium on said second interlayer insulator, said conductive film being in contact with said silicon nitride layer of said first interlayer insulator;

a third interlayer insulator on said second interlayer insulator and said conductive film; and a pixel electrode on said third interlayer insulator and connected with the other one of said source and said drain.

20. An active matrix type display circuit as claimed in claim 19, wherein said first interlayer insulator has an upper layer comprising an organic resin and a lower layer comprising silicon nitride.

21. An active matrix type display device circuit having at least one thin film transistor, comprising:

a semiconductor layer formed over a substrate, said semiconductor layer having a channel region, source and drain regions;

at least one gate electrode formed over said semiconductor layer with a gate insulating film interposed therebetween;

a first interlayer insulating film formed over said gate electrode, said first interlayer insulating film comprising a silicon nitride layer and an organic resin layer thereon;

a second interlayer insulating film formed on said first interlayer insulating film, said second interlayer insulating film comprising an organic resin, and a conductive film formed on said second interlayer insulating film, said conductive film being connected to said silicon nitride layer through a contact hole formed in said organic resin layer of said first interlayer insulating film and said second interlayer insulating film, wherein an auxiliary capacitor is formed by said semiconductor layer, said conductive film, and said silicon nitride layer of said first interlayer insulating film.

22. An active matrix type display circuit according to claim 21, wherein a thickness of said silicon nitride layer is 1000 Å or less.

23. An active matrix type display device according to claim 21, wherein said organic resin layer includes polyimide.

24. An active matrix type display device circuit having at least one thin film transistor, comprising:

a semiconductor layer formed over a substrate, said semiconductor layer having a channel region, source and drain regions;

at least one gate electrode formed over said semiconductor layer with a gate insulating film interposed therebetween;

a first interlayer insulating film formed over said gate electrode, said first interlayer insulating film comprising a silicon nitride layer and an organic resin layer thereon;

a second interlayer insulating film formed on said first interlayer insulating film, said second interlayer insulating film comprising an organic resin;

a conductive film formed on said second interlayer insulating film, said conductive film being connected to said silicon nitride layer through a contact hole formed in said organic resin layer of said first interlayer insulating film and said second interlayer insulating film;

a third interlayer insulating film formed over said second interlayer insulating film and said conductive film, and a pixel electrode formed on said third interlayer insulating film, said pixel electrode being connected to one of said source and drain regions.

25. An active matrix type display circuit according to claim 24, wherein an auxiliary capacitor is formed by said semiconductor layer, said conductive film, and said silicon nitride layer of said first interlayer insulating film.

26. An active matrix type display circuit according to claim 24, wherein a thickness of said silicon nitride layer is 1000 Å or less.

27. An active matrix type display device according to claim 24, wherein said organic resin layer includes polyimide.

* * * * *